(12) United States Patent
Kamijima

(10) Patent No.: US 6,399,285 B1
(45) Date of Patent: Jun. 4, 2002

(54) METHOD FOR FORMING A THIN FILM AND FOR MANUFACTURING A THIN FILM

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 142 days.

(21) Appl. No.: 09/604,077

(22) Filed: Jun. 27, 2000

(30) Foreign Application Priority Data

Aug. 27, 1999 (JP) .......................................... 11-242281

(51) Int. Cl.$^7$ .............................. G03F 7/30; G03F 7/26; B44C 1/22; C25D 5/02; G11B 5/127
(52) U.S. Cl. ...................... 430/313; 430/311; 430/312; 430/315; 430/319; 430/323; 430/324; 430/320; 205/122; 205/125; 205/119; 29/603.12; 29/603.18; 216/22; 216/41; 216/49
(58) Field of Search ........................ 29/603.12, 603.18; 216/22, 41, 49; 205/122, 125, 119; 430/320, 315, 324, 312, 313, 314, 316, 318, 319, 323, 311

(56) References Cited

FOREIGN PATENT DOCUMENTS

| JP | 9-232220 | * | 9/1997 |
| JP | A-10-162316 | | 6/1998 |

OTHER PUBLICATIONS

Derwent Abstract No.:1997–495644—English Abstract for JP 9–232220.*

Machine–Assisted English Translation of JP 9–232220 Provided by Japan Patent Office, 1997.*

* cited by examiner

*Primary Examiner*—Janet Baxter
*Assistant Examiner*—Sin J. Lee
(74) *Attorney, Agent, or Firm*—Oliff & Berridge PLC

(57) ABSTRACT

An optical transparent film is formed so as to cover a first thin film element and a marker, and flattened. A resist-cover is formed on the part of the optical transparent film above the marker. A plate underfilm is formed on the optical transparent film and the resist-cover. The resist-cover is removed from the optical transparent film. A resistframe is fabricated on the part of the optical transparent film including the plate underfilm above the first thin film element on the basis of the marker which is visible via the optical transparent film from the removed part of the resist-cover. Then, a plate film is formed on the part of the plate underfilm enclosed by the resistframe.

24 Claims, 4 Drawing Sheets

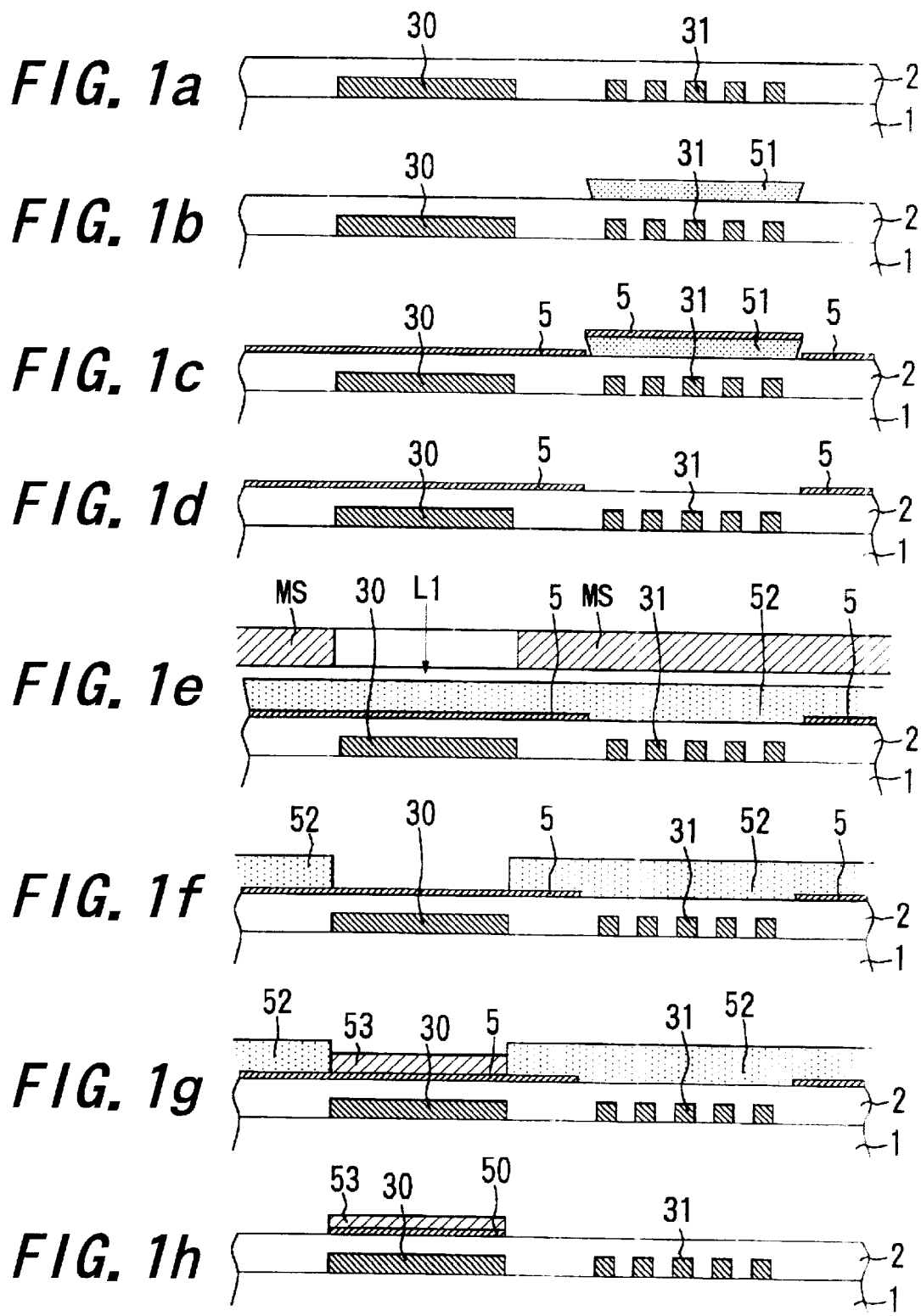

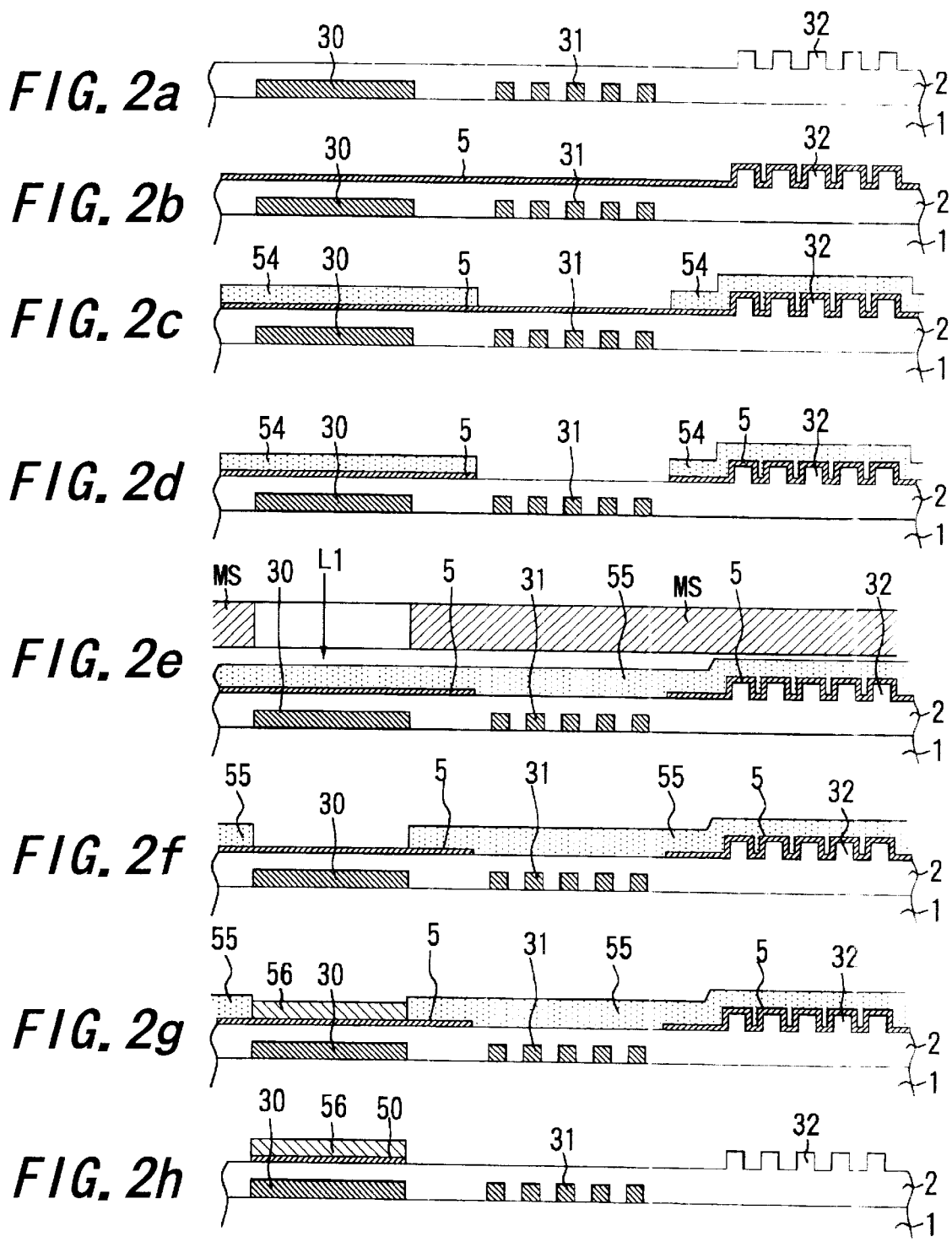

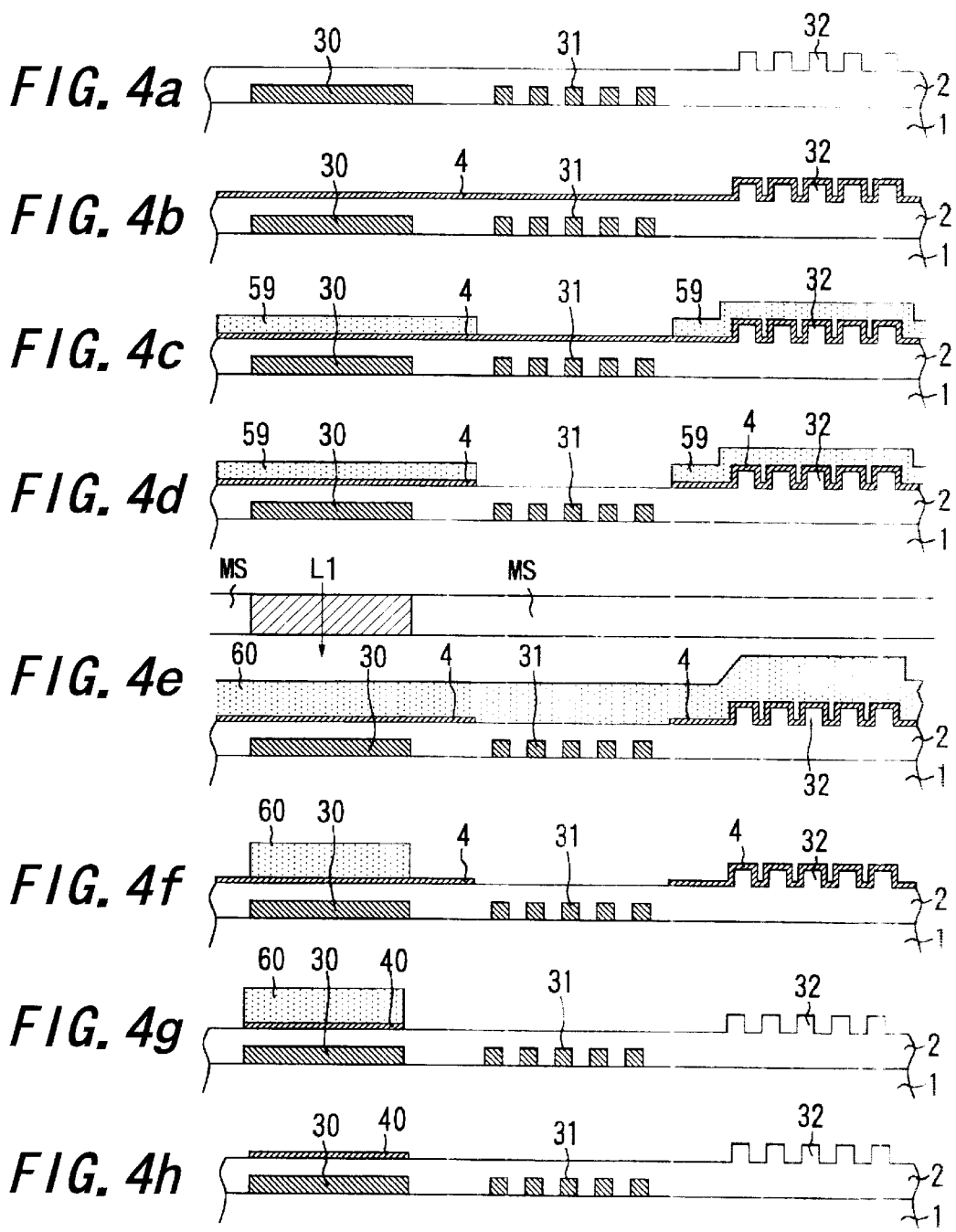

METHOD FOR FORMING A THIN FILM AND FOR MANUFACTURING A THIN FILM

BACKGROUND OF THE INVENTION

1) Field of the Invention

This invention relates to a method for forming a thin film and a method for manufacturing a thin film magnetic head. These methods are usable for alignment of two thin film elements to be formed at different stacking positions in a thin film magnetic head. Moreover, these methods are usable for forming a high density wire pattern in various circuit elements and integrated circuits.

2) Description of Related Art

It is well known that thin film magnetic heads for magnetic disk driving device constituting a computer memory have multilayered structures, and are manufactured, on a wafer, by film-forming techniques such as sputtering or plating and high precise patterning techniques such as photolithography, wet-etching and dry-etching.

In manufacturing a thin film magnetic head, various thin film elements to be formed at different stacking positions are required to be aligned precisely. In a composite type thin film magnetic head as a typical example, a writing element and a MR reading element are required to be aligned precisely.

Conventionally, the alignment is carried out as follows: A pattern for a first marker is formed on a mask to define a first thin film element pattern (e.g., a reading element pattern). Then, the first thin film element and the first marker are formed on a support at the same time. The marker forming technique is described in Kokai Publication Kokai Hei 10-162316 (JP A 10-162316), for example.

Then, an optical transparent film (a flat film) is formed, of $Al_2O_3$ or $SiO_2$ on the support so as to cover the first thin film element and the first marker.

Subsequently, the optical transparent film is flattened, and on the flattened surface is formed a second marker on the basis of the first marker.

Then, a thin film to constitute a second thin film element (e.g., a writing element) is formed on the optical transparent film. The thin film, which is optically opaque, is generally made of a magnetic material.

Subsequently, the thin film is patterned by a photolithography process to form the second thin film element. Since the thin film is optically opaque, the photolithography process is carried out on the basis of the second marker.

In the above conventional manufacturing method, there is the problem that since the photolithography process is carried out on the basis of the second marker which is formed on the basis of the first marker, not directly on the basis of the first marker having precise alignment for the first thin film element, the alignment precision of the second thin film element for the first thin film element is degraded.

SUMMARY OF THE INVENTION

It is an object of the present invention to provide a method for forming a thin film and a method for manufacturing a thin film magnetic head which can align the first and second thin film elements to be formed at the different stacking positions precisely and stably.

For achieving the above object, this invention is directed at four type of forming methods of a thin film.

<First Type of forming method>

The first type of forming method includes the following steps.

First of all, an optical transparent film is formed on a support so as to cover a first thin film element and marker on the support, and then, flattened.

Subsequently, a resist-cover is formed on the part of the optical transparent film above the marker by a photolithography process. Thereafter, a plate underfilm is formed on the optical transparent film and the resist-cover, and the resist-cover is removed from the optical transparent film.

Next, a resistframe is formed on the part of the optical transparent film including the plate underfilm above the first thin film element on the basis of the marker which is visible from the removed area of the resist-cover via the optical transparent film. Since the resist-cover and the part of the plate underfilm thereon are removed from on the optical transparent film, an exposing apparatus can recognize the marker via the optical transparent film. Therefore, the photolithography process to form the resistframe can be performed on the basis of the marker visible via the optical transparent film. As a result, the resistframe can be aligned for the first thin film element precisely and stably.

Thereafter, a plate film is formed on the part of the plate underfilm enclosed by the resistframe. After the resistframe is removed, the plate underfilm is patterned alongside the pattern of the plate film. As a result, the patterned plate film can be aligned for the first thin film element precisely and stably.

<Second type of forming method>

The second type of forming method includes the following steps.

First of all, an optical transparent film is formed on a support so as to cover a first thin film element and a first marker on the support, and then, flattened.

Then, a second marker is formed on the optical transparent film on the basis of the first marker. And a plate underfilm is formed on the optical transparent film.

Thereafter, the part of the plate underfilm on the optical transparent film above the first marker is milled on the basis of the second marker.

Next, a resistframe is formed on the part of the optical transparent film including the plate underfilm above the first thin film element on the basis of the first marker which is visible from the removed area of the plate underfilm via the optical transparent film. Since the part of the plate underfilm above the first marker are removed from on the optical transparent film by milling, an exposing apparatus can recognize the first marker via the optical transparent film. Therefore, the photolithography process to form the resistframe can be performed on the basis of the first marker visible via the optical transparent film. As a result, the resistframe can be aligned for the first thin film element precisely and stably.

Thereafter, a plate film is formed on the part of the plate underfilm enclosed by the resistframe. After the resistframe is removed, the plate underfilm is patterned alongside the pattern of the plate film. As a result, the patterned plate film can be aligned for the first thin film element precisely and stably.

<Third type of forming method>

The third type of forming method includes the following steps.

First of all, an optical transparent film is formed on a support so as to cover a first thin film element and marker on the support, and then, flattened.

Subsequently, a resist-cover is formed on the part of the optical transparent film above the marker by a photolithography process. Thereafter, an optical opaque film is formed on the optical transparent film and the resist-cover Then, the resist-cover is removed from the optical transparent film. The resist-cover can be easily removed by a lift-off method. In removing the resist-cover, the part of the optical opaque film thereon is also removed. Therefore, an exposing apparatus can recognize the marker via the optical transparent film.

Subsequently, the optical opaque film is patterned by a photolithography process to form a second thin film element. In this case, the photolithography process can be carried out on the basis of the marker which is visible via the optical transparent film. Therefore, the first and second thin film elements which are positioned vertically can be aligned precisely and stably.

<Fourth type of forming method>

The fourth type of forming method includes the following steps.

First of all, an optical transparent film is formed on a support so as to cover a first thin film element and a first marker on the support, and then, flattened.

Then, a second marker is formed on the optical transparent film on the basis of the first marker. And an optical opaque film is formed on the optical transparent film.

Thereafter, the part of the optical opaque film on the optical transparent film above the first marker is milled on the basis of the second marker. Since the milling is carried out so that the first marker can be recognized via the optical transparent film, it is not required to be done precisely. Therefore, there is no problem in the milling on the basis of the second marker.

Then, the optical opaque film is patterned by a photolithography process to form a second thin film element. This photolithography process is carried out on the basis of the first marker which is visible via the optical transparent film.

As mentioned above, since the part of the optical opaque film above the first marker are removed from the optical transparent film by milling, an exposing apparatus can recognize the first marker via the optical transparent film. Therefore, the photolithography process to form the second thin film element can be performed on the basis of the first marker visible via the optical transparent film. As a result, the first and second thin film elements which are positioned vertically can be aligned for the first thin film element precisely and stably.

The other objects, configurations and advantages will be explained in detail, with reference to the attaching drawings in embodiments.

BRIEF DESCRIPTION OF THE DRAWINGS

For a better understanding of this invention, reference is made to the attached drawings, wherein:

FIGS. 1a–1h are cross sectional views showing the steps in the first type of forming method of a thin film of the present invention, FIGS. 2a–2h are cross sectional views showing the steps in the second type of forming method of a thin film of the present invention, FIGS. 4a–4h are cross sectional views showing the steps in the fourth type of forming method of a thin film of the present invention.

DETAILED DESCRIPTION OF PREFERRED EMBODIMENTS

<First type of forming method>

Figure 3A:
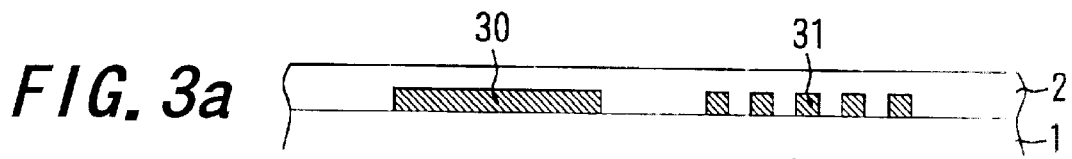
FIGS. 3a–3h are cross sectional views showing the steps in the third type of forming method of a thin film of the present invention.

FIGS. 1a–1h are cross sectional views showing the steps in the first type of forming method of a thin film of the present invention. In this embodiment, a MR reading element and an inductive type writing element constituting a composite type thin film magnetic head will be aligned. The MR element normally includes a magnetoresistive effective film which may have a spin valve film or a ferromagnetic tunnel junction effective film.

First of all, as shown in FIG. 1a, an optical transparent film 2 is formed on a support 1 so as to cover a first thin film element 30 constituting the MR reading element and a marker 31 thereon. The support 1 is made of an insulating material such as $Al_2O_3$ or $SiO_2$. The optical transparent film may be formed flat. In this case, the optical transparent film 2 is made of $Al_2O_3$ or $SiO_2$. The marker may have various pattern shapes and pattern periods.

Next, as shown in FIG. 1b, a resist-cover 51 is formed on the part of the optical transparent film 2 above the marker 31 by a photolithography process.

Before the resist-cover 51 is formed, the optical transparent film 2 is patterned by chemical mechanical polishing (hereinafter, called "CMP"). The resist-cover 51 is formed, of a well known photoresist material, so as to have a given pattern by the above photolithography process on the basis of the marker 31.

Then, as shown in FIG. 1c, a plate underfilm 5 is formed on the optical transparent film 2 and the resist-cover 51 by sputtering or the like. The plate underfilm 5 may be made of a material normally used for a pole portion and a yoke portion of the inductive type writing element.

Subsequently, as shown in FIG. 1d, the resist-cover 51 is removed from the optical transparent film 2. The resist-cover 51 can be easily removed by a lift-off method. In this case, the part of the plate underfilm 5 stuck on the resist-cover 51 is removed at the same time. Therefore, an exposing apparatus can recognize the marker 31 via the optical transparent film 2.

Then, as shown in FIG. 1e, a photoresist 52 is applied on the optical transparent film 2 and the plate underfilm 5, and a photomask MS is aligned on the photoresist 52 on the basis of the marker 31 which is visible via the optical transparent film 2 and the photoresist 52. The photoresist 52 is exposed and developed via the photomask MS. As a result, as shown in FIG. 1f, the photoresist frame 52 which has a given pattern and is aligned precisely can be fabricated on the part of the plate underfilm 5 above the first thin film element 30 to constitute the MR reading element. In this case, since the resist-cover 51 and the part of the plate underfilm 5 are removed from the optical transparent film 2, the exposing apparatus can recognize the marker 31 via the optical transparent film. Therefore, the photolithography process to fabricate the resistframe 52 can be performed on the basis of the marker 31 which is visible via the optical transparent film 2. Therefore, the resistframe 52 can be aligned for the first thin film element 30 precisely and stably.

Then, as shown in FIG. 1g, a plate film 53 is formed on the part of the plate underfilm 5 uncovered with the resist-frame 52. The plate film 53 may be made of a magnetic material such as permalloy to constitute the pole portion and yoke portion in the inductive type writing element.

Subsequently, the resistframe 52 is removed (peeled), and the excess portion of the plate underfilm 5 around the resistframe 52 is removed by milling or the like. As a result, the patterned plate film to constitute the pole portion and yoke portion of the inductive type writing element can be aligned for the first thin film element 30 to constitute the MR reading element.

<Second type of forming method>

FIGS. 2a–2h are cross sectional views showing the steps in the second type of forming method of a thin film of the present invention. In this embodiment, a MR reading element and an inductive type writing element constituting a composite type thin film magnetic head will be aligned. The same reference is given to the same parts as in FIGS. 1a–1h. A support 1, a first thin film element 30 and a first marker 31 have similar fashion to the first type of forming method shown in FIGS. 1a–1h.

First of all, as shown in FIG. 2a, an optical transparent film 2 is formed on a support 1 so as to cover a first thin film element 30 constituting the MR reading element and a marker 31 thereon. The optical transparent film may be formed flat. In this case, the optical transparent film 2 is made of $Al_2O_3$ or $SiO_2$. Moreover, a second marker 32 is formed on the optical transparent film 2 on the basis of the first marker 31. The second marker 32 may have various pattern shapes and pattern periods.

Next, as shown in FIG. 2b, the plate underfilm 5 as an optical opaque film is formed on the optical transparent film 2. The plate underfilm 5 has similar fashion to the first type of forming method shown in FIGS. 1a–1h.

Subsequently, as shown in FIG. 2c, a resistframe 54 is formed on the area except the part of the optical transparent film 2 above the first marker 31 by a photolithography process. The resistframe 54 can be aligned on the basis of the second marker 32.

Then, as shown in FIG. 2d, the part of the plate underfilm 5 uncovered with the resistframe 54 is removed by milling on the basis of the second marker 32. The milling is not required to be carried out precisely because it is done so as to make visible the first marker 31 via the optical transparent film 2. Therefore, there is no problem in the above milling on the basis of the second marker 32.

Next, as shown in FIG. 2e, a photoresist 55 is applied on the optical transparent film 2 and the plate underfilm 5, and a photomask MS is aligned above the photoresist 55 on the basis of the marker 31 which is visible via the optical transparent film 2 and the photoresist 55. Then, the photoresist 55 is exposed with an exposing light L1 and developed to form a resistframe 55 on the part of the plate underfilm 5 above the first thin film element 30, as shown in FIG. 2f.

Subsequently, as shown in FIG. 2g, a plate film 56 is formed on the part of the plate underfilm 5 uncovered with the resistframe 55. The plate film 56 may be made of a magnetic material such as permalloy constituting the pole portion and the yoke portion of the inductive type writing element.

Next, the resistframe 55 is removed and the excess part of the plate underfilm 5 is removed. Consequently, as shown in FIG. 2h, the plate film 56 to constitute the pole portion and the yoke portion of the inductive type writing element is aligned for the first thin film 30 to constitute the MR reading element precisely and stably.

<Third type of forming method>

FIGS. 3a–3h are cross sectional views showing the steps in the third type of forming method of a thin film of the present invention. The third type of forming method may be applied for a thin film magnetic head and a high density wiring pattern in various circuit elements and integral circuits. The same reference is given to the same parts as in FIGS. 1a–1h.

First of all, as shown in FIG. 3a, an optical-transparent film 2 is formed on a support 1 so as to cover a first thin film element 30 constituting a MR reading element, for example and a marker 31 thereon. The support 1 is made of an insulating material such as $Al_2O_3$ or $SiO_2$. The optical transparent film 2 may be formed flat. In this case, the optical transparent film 2 is made of $Al_2O_3$ or $SiO_2$. The marker 31 may have various pattern shapes and pattern periods.

Figure 3B:
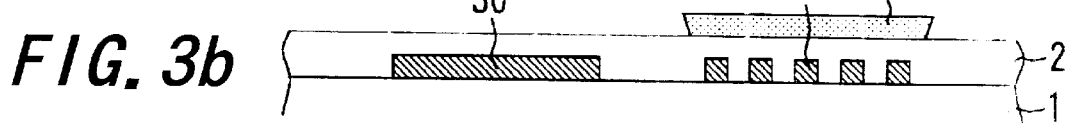

Next, as shown in FIG. 3b, a resist-cover 51 is formed on the part of the optical transparent film 2 above the marker 31 by a photolithography process.

Before the resist-cover 51 is formed, the optical transparent film 2 is patterned by CMP. The resist-cover 51 is formed, of a well known photoresist material, so as to have a given pattern by a photolithography process on the basis of the marker 31.

Figure 3C:
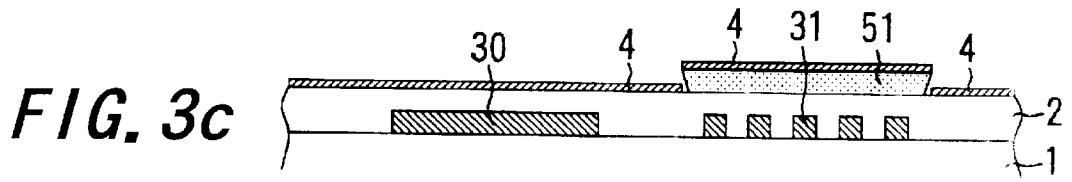

Then, as shown in FIG. 3c, an optical opaque film 4 is formed, of a metallic material, on the optical transparent film 2 and the resist-cover 51 by sputtering or the like.

Figure 3D:
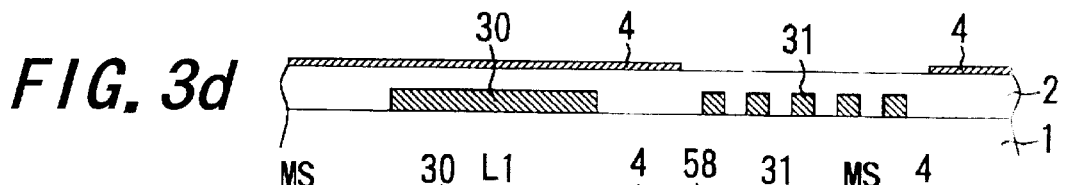

Subsequently, as shown in FIG. 3d, the resist-cover 51 is removed from the optical transparent film 2. The resist-cover 51 can be easily removed by a lift-off method. In this case, the part of the optical opaque film 4 stuck on the resist-cover 51 is removed at the same time. Therefore, an exposing apparatus can recognize the marker 31 via the optical transparent film 2.

Figure 3E:
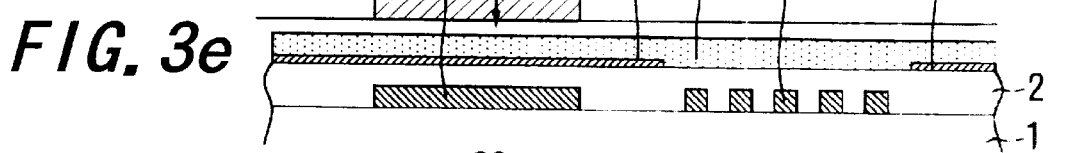
Figure 3F:
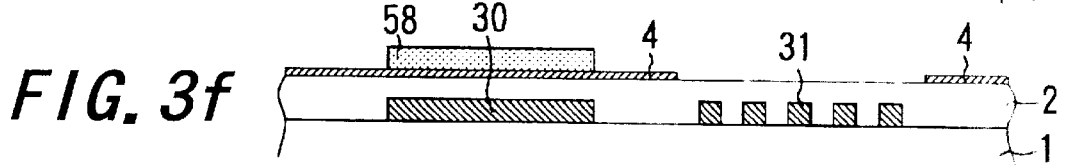

Then, as shown in FIG. 3e, a photoresist 58 is applied on the optical transparent film 2 and the optical opaque film 4, and a photomask MS is aligned on the photoresist 58 on the basis of the marker 31 which is visible via the optical transparent film 2 and the photoresist 58. The photoresist 58 is exposed and developed via the photomask MS. As a result, as shown in FIG. 3f, the photoresist frame 58 is fabricated on the part of the optical opaque film 4 above the first thin film element 30 to constitute the MR reading element.

Figure 3G:
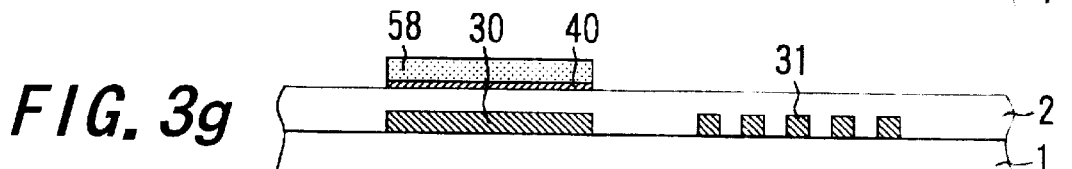
Figure 3H:
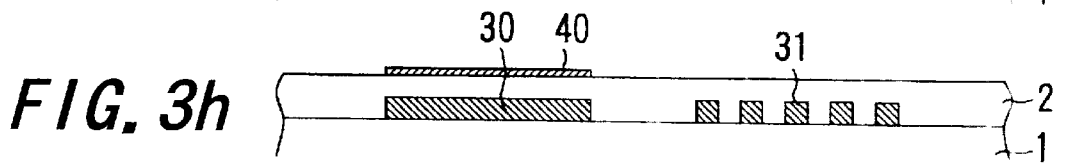

Then, as shown in FIG. 3g, the part of the optical opaque film 4 uncovered with the resistframe 58 is removed by milling or the like. Therefore, as shown in FIG. 3h, a second thin film element 40 having a given pattern can be obtained. In applying the third type of forming method for a thin film magnetic head, the second thin film element constitutes at least one part of its writing element.

In this case, since the resist-cover 51 and the part of the optical opaque film 4 are removed from the optical transparent film 2, an exposing apparatus can recognize the marker 31 via the optical transparent film. Therefore, the photolithography process to fabricate the resistframe 58 can be performed on the basis of the marker 31 which is visible via the optical transparent film 2. Therefore, the first thin film element 30 and the second thin film element 40 are can be precisely and stably aligned vertically.

<Fourth type of forming method>

FIGS. 4a–4h are cross sectional views showing the steps in the fourth type of forming method of a thin film of the present invention. The same reference is given to the same parts as in FIGS. 3a–3h. A support 1, a first thin film element 30 and a first marker 31 have similar fashion to the first type of forming method shown in FIGS. 3a–3h.

First of all, as shown in FIG. 4a, an optical transparent film 2 is formed on a support 1 so as to cover a first thin film element 30 constituting, for example, a MR reading element and a marker 31 thereon. The optical transparent film may be formed flat. In this case, the optical transparent film 2 is made of $Al_2O_3$ or $SiO_2$. Moreover, a second marker 32 is formed on the optical transparent film 2 on the basis of the first marker 31. The second marker 32 may have various pattern shapes and pattern periods.

Next, as shown in FIG. 4b, an optical opaque film 4 is formed, of a metallic material, on the optical transparent film 2.

Subsequently, as shown in FIG. 4c, a resistframe 59 is formed on the area except the part of the optical transparent film 2 above the first marker 31 by a photolithography process. The resistframe 59 can be aligned on the basis of the second marker 32.

Then, as shown in FIG. 4d, the part of the optical opaque film 4 uncovered with the resistframe 59 is removed by milling on the basis of the second marker 32. The milling is not required to be carried out precisely because it is done so as to make visible the first marker 31 via the optical transparent film 2. Therefore, there is no problem in the above milling on the basis of the second marker 32.

Next, as shown in FIG. 4e, a photoresist 60 is applied on the optical transparent film 2 and the optical opaque film 4, and a photomask MS is aligned above the photoresist 60 on the basis of the marker 31 which is visible via the optical transparent film 2 and the photoresist 60. Then, the photoresist 60 is exposed with an exposing light L1 and developed to form a resistframe 60 on the part of the optical opaque film 4 above the first thin film element 30, as shown in FIG. 4f.

Subsequently, as shown in FIG. 4g, the part of the optical opaque film 4 uncovered with the resistframe 60 is removed by milling. Consequently, as shown in FIG. 4h, a second thin film 40 having a given pattern can be obtained. In applying the fourth type of forming method for a thin film magnetic head, the thin film element 40 constitutes at least one part of its writing element.

In this case, since the part of the optical opaque film 4 above the first marker 31 is removed from the optical transparent film 2 by the milling, an exposing apparatus can recognize the marker 31 via the optical transparent film 2. Therefore, the photolithography process to fabricate the second thin film element 40 can be performed on the basis of the marker 31 which is visible via the optical transparent film 2. Therefore, the first thin film element 30 and the second thin film element 40 are can be precisely and stably aligned vertically.

This invention is not limited to the above embodiments and every kind of variation and modification may be made without departing from the scope of the present invention.

As mentioned above, according to the present invention, a method for forming a thin film and a method for manufacturing a thin film magnetic head which can align the first and second thin film elements to be formed at the different stacking positions precisely and stably can be provided.

What is claimed is:

1. A method for forming a thin film comprising the steps of:

forming an optical transparent film on a support so as to cover a first thin film element and a marker thereon, flattening the optical transparent film, forming a resist-cover on the part of the optical transparent film above the marker by a photolithography process, forming a plate underfilm on the optical transparent film and the resist-cover, removing the resist-cover from the optical transparent film, fabricating a resistframe on the part of the optical transparent film including the plate underfilm above the first thin film element by a photolithography process on the basis of the marker which is visible via the optical transparent film from the removed part of the resist-cover, forming a plate film on the part of the plate underfilm enclosed by the resistframe, and patterning the plate underfilm alongside the patterned plate film after removing the resistframe.

2. A method for forming a thin film as defined in claim 1, wherein the optical transparent film is made of $Al_2O_3$ or $SiO_2$.

3. A method for forming a thin film comprising the steps of:

forming an optical transparent film on a support so as to cover a first thin film element and a marker thereon, flattening the optical transparent film, forming a second marker on the optical transparent film on the basis of the first marker, forming a plate underfilm on the optical transparent film, milling the part of the plate underfilm on the optical transparent film above the first marker on the basis of the second marker, fabricating a resistframe on the part of the optical transparent film including the plate underfilm above the first thin film element by a photolithography process on the basis of the first marker which is visible via the optical transparent film from the removed part of the plate underfilm, forming a plate film on the part of the plate underfilm enclosed by the resistframe, and patterning the plate underfilm alongside the patterned plate film after removing the resistframe.

4. A method for forming a thin film as defined in claim 3, wherein the optical transparent film is made of $Al_2O_3$ or $SiO_2$.

5. A method for forming a thin film comprising the steps of:

forming an optical transparent film on a support so as to cover a first thin film element and a marker thereon, flattening the optical transparent film, forming a resist-cover on the part of the optical transparent film above the marker by a photolithography process, forming an optical opaque film on the optical transparent film and the resist-cover, removing the resist-cover from the optical transparent film, and patterning the optical opaque film by a photolithography process on the basis of the marker which is visible via the optical transparent film to form a second film element.

6. A method for forming a thin film as defined in claim 5, wherein the optical transparent film is made of $Al_2O_3$ or $SiO_2$.

7. A method for forming a thin film as defined in claim 6, wherein the optical opaque film is made of a metallic material.

8. A method for forming a thin film as defined in claim 5, wherein the optical opaque film is made of a metallic material.

9. A method for forming a thin film comprising the steps of:

forming an optical transparent film on a support so as to cover a first thin film element and a marker thereon, flattening the optical transparent film, forming a second marker on the optical transparent film on the basis of the first marker, forming an optical opaque film on the optical transparent film, milling the part of the optical opaque film on the optical transparent film above the first marker on the basis of the second marker, and patterning the optical opaque film by a photolithography process on the basis of the first marker which is visible via the optical transparent film to form a second film element.

10. A method for forming a thin film as defined in claim 9, wherein the optical transparent film is made of $Al_2O_3$ or $SiO_2$.

11. A method for forming a thin film as defined in claim 10, wherein the optical opaque film is made of metallic material.

12. A method for forming a thin film as defined in claim 9, wherein the optical opaque film is made of a metallic material.

13. A method for manufacturing a thin film magnetic head comprising the steps of:

forming an optical transparent film on a support so as to cover a first thin film element and a marker thereon, flattening the optical transparent film, forming a resist-cover on the part of the optical transparent film above the marker by a photolithography process, forming a plate underfilm on the optical transparent film and the resist-cover, removing the resist-cover from the optical transparent film, fabricating a resistframe on the part of the optical transparent film including the plate underfilm above the first thin film element by a photolithography process on the basis of the marker which is visible via the optical transparent film from the removed part of the resist-cover, forming a plate film to constitute a writing element on the part of the plate underfilm enclosed by the resistframe, and patterning the plate underfilm alongside the patterned plate film after removing the resistframe.

14. A method for manufacturing a thin film magnetic head as defined in claim 13, wherein the optical transparent film is made of $Al_2O_3$ or $SiO_2$.

15. A method for manufacturing a thin film magnetic head comprising the steps of:

forming an optical transparent film on a support so as to cover a first thin film element and a marker thereon, flattening the optical transparent film, forming a second marker on the optical transparent film on the basis of the first marker, forming a plate underfilm on the optical transparent film, milling the part of the plate underfilm on the optical transparent film above the first marker on the basis of the second marker, fabricating a resistframe on the part of the optical transparent film including the plate underfilm above the first thin film element by a photolithography process on the basis of the first marker which is visible via the optical transparent film from the removed part of the plate underfilm, forming a plate film to constitute a writing element on the part of the plate underfilm enclosed by the resistframe, and patterning the plate underfilm alongside the patterned plate film after removing the resistframe.

16. A method for manufacturing a thin film magnetic head as defined in claim 15, wherein the optical transparent film is made of $Al_2O_3$ or $SiO_2$.

17. A method for manufacturing a thin film magnetic head comprising the steps of:

forming an optical transparent film on a support so as to cover a first thin film element and a marker thereon, flattening the optical transparent film, forming a resist-cover on the part of the optical transparent film above the marker by a photolithography process, forming an optical opaque film on the optical transparent film and the resist-cover, removing the resist-cover from the optical transparent film, and patterning the optical opaque film by a photolithography process on the basis of the marker which is visible via the optical transparent film to form at least one part of a writing element.

18. A method for manufacturing a thin film magnetic head as defined in claim 17, wherein the optical transparent film is made of $Al_2O_3$ or $SiO_2$.

19. A method for manufacturing a thin film magnetic head as defined in claim 18, wherein the optical opaque film is made of a metallic material.

20. A method for manufacturing a thin film magnetic head as defined in claim 17, the optical opaque film is made of a metallic material.

21. A method for manufacturing a thin film magnetic head comprising the steps of:

forming an optical transparent film on a support so as to cover a first thin film element and a marker thereon, flattening the optical transparent film, forming a second marker on the optical transparent film on the basis of the first marker, forming an optical opaque film on the optical transparent film, milling the part of the optical opaque film on the optical transparent film above the first marker on the basis of the second marker, and patterning the optical opaque film by a photolithography process on the basis of the first marker which is visible via the optical transparent film to form at least one part of a writing element.

22. A method for manufacturing a thin film magnetic head as defined in claim 21, wherein the optical transparent film is made of $Al_2O_3$ or $SiO_2$.

23. A method for manufacturing a thin film magnetic head as defined in claim 22, wherein the optical opaque film is made of a metallic material.

24. A method for manufacturing a thin film magnetic head as defined in claim 21, wherein the optical opaque film is made of a metallic material.

* * * * *